(12) United States Patent
Tseng et al.

(10) Patent No.: US 8,051,560 B2
(45) Date of Patent: Nov. 8, 2011

(54) METHOD OF FABRICATING A SOLDER PAD STRUCTURE

(75) Inventors: Tzyy-Jang Tseng, Hsinchu (TW); Shu-Sheng Chiang, Taipei (TW)

(73) Assignee: Unimicron Technology Corp., Kwei-San Industrial Zone, Taoyuan (TW)

( * ) Notice: Subject to any disclaimer, the term of this patent is extended or adjusted under 35 U.S.C. 154(b) by 95 days.

(21) Appl. No.: 12/580,256

(22) Filed: Oct. 16, 2009

(65) Prior Publication Data

US 2011/0091697 A1     Apr. 21, 2011

(51) Int. Cl.
*H01K 3/10* (2006.01)
(52) U.S. Cl. .................. 29/852; 29/829; 29/840; 29/843
(58) Field of Classification Search .................... 29/829, 29/840, 843, 852
See application file for complete search history.

(56) References Cited

U.S. PATENT DOCUMENTS

| | | | | |
|---|---|---|---|---|
| 4,440,801 | A * | 4/1984 | Aviram et al. | 427/558 |
| 5,670,262 | A * | 9/1997 | Dalman | 428/458 |
| 7,438,969 | B2 * | 10/2008 | Kojima et al. | 428/209 |
| 2007/0085126 | A1 * | 4/2007 | Hsu | 257/306 |
| 2007/0247822 | A1 * | 10/2007 | Naundorf | 361/748 |

FOREIGN PATENT DOCUMENTS

TW    1288591    10/2007

* cited by examiner

*Primary Examiner* — Carl Arbes
(74) *Attorney, Agent, or Firm* — Winston Hsu; Scott Margo

(57) ABSTRACT

A method for fabricating a solder pad structure. A circuit board having thereon at least one copper pad is provided. A solder resist is formed on the circuit board and covers the copper pad. A solder resist opening, which exposes a portion of the copper pad, is formed in the solder resist by laser. The laser also creates a laser activated layer on sidewalls of the solder resist opening. A chemical copper layer is then grown from the exposed copper pad and concurrently from the laser activated layer.

17 Claims, 7 Drawing Sheets

METHOD OF FABRICATING A SOLDER PAD STRUCTURE

BACKGROUND OF THE INVENTION

1. Field of the Invention

The present invention relates generally to the fabrication of circuit boards. More particularly, the present invention relates to a solder pad structure for printed circuit boards and fabrication method thereof.

2. Description of the Prior Art

Rapid changes in the semiconductor industry will continue toward higher functionality that leads to higher I/O counts, pushing packaging towards new, smaller, and higher density architectures. The semiconductor industry has developed features of 30 nm for high performance microprocessors. However, the feature size that the packaging industry can produce is about 15~20 μm. A huge technical gap exists between semiconductor and packaging. In order to keep pace with semiconductor process development, a process for finer pitch wiring substrate is necessary.

FIG. 1 to FIG. 5 demonstrate a conventional solder resist process and the solder paste printing process after the solder resist process. As shown in FIG. 1, a surface wiring structure 1a is formed on a surface of the circuit board 1. The surface wiring structure 1a includes a plurality of solder pad structures 2 and fine trace 3. For the sake of simplicity, the conductive via holes or other inner layer interconnection are not shown in the figures.

As shown in FIG. 2, after the formation of the surface wiring structure 1a, a solder resist layer 4 is formed to cover the surface of the circuit board 1. Typically, the solder resist layer 4 is composed of photo-sensitive polymers or inks, and the solder resist layer 4 may be liquid type or solid film type. It is well known that the solder resist layer 4 is used to protect the circuit wires that are not covered with tin and prevent solder from bridging between conductive traces, thereby preventing short circuits.

As shown in FIG. 3, after coating the solder resist layer 4, a conventional photolithographic process including exposure and development is carried out to form a plurality of solder resist openings 4a in the solder resist layer 4. Each of the solder resist openings 4a exposes a portion of each of the underlying solder pad structures 2.

As shown in FIG. 4, prior to the formation of electroless nickel/immersion gold (ENIG), a chemical micro-etching and cleaning process is performed to remove the oxide residuals formed on the exposed surface of the solder pad structures 2 from the solder resist openings 4a. However, this cleaning process results in undercut defects 4b at the bottom of the solder resist openings 4a.

Subsequently, as shown in FIG. 5, a conventional electroless nickel/immersion gold (ENIG) process is carried out to form an ENIG surface finish layer 5 having a thickness of about 0.5-1.5 micrometers on the exposed top surface of the solder pad structures 2 within the solder resist openings 4a. A conventional solder paste printing process is then performed to fill the solder resist openings 4a with solder paste 6. Thereafter, the circuit board 1 is subjected to reflow and pressing processes.

However, the above-described prior art method has several drawbacks. First, the yield of the solder paste printing process reduces as the pitch between the solder pad structures 2 on the flip-chip side of the circuit board becomes smaller and smaller. Second, the adhesion of solder paste 6 to the solder resist layer 4 is poor. Third, the undercut defects 4b formed during the chemical micro-etching and cleaning process create high stress points in the subsequent processes leading to reliability problems of the circuit board. In light of the above, there is a strong need in this industry to provide an improved method for fabricating a circuit board that is capable of solving the shortcomings and problems of the prior art.

SUMMARY OF THE INVENTION

It is one object of the present invention to provide an improved solder pad structure for printed circuit boards and fabrication method thereof in order to solve the above-described prior art problems.

According to one preferred embodiment of this invention, a method for fabricating a solder pad structure of a circuit board includes: providing a circuit board having thereon at least one copper pad structure; forming a solder resist layer on a surface of the circuit board; subjecting the solder resist layer to a laser to thereby form a solder resist opening exposing a portion of the copper pad structure, the laser simultaneously forming a laser-activated layer on sidewall of the solder resist opening; and growing copper from the laser-activated layer on sidewall of the solder resist opening and from the exposed portion of the copper pad structure.

According to another preferred embodiment of this invention, a method for fabricating a solder pad structure of a circuit board includes: providing a circuit board having thereon at least one copper pad structure; forming a solder resist layer on a surface of the circuit board; forming a peelable film on the solder resist layer; subjecting the peelable film and the solder resist layer to a laser to thereby form a solder resist opening exposing a portion of the copper pad structure; forming a seed layer on interior sidewall of the solder resist opening; peeling off the peelable film from the solder resist layer; and filling the solder resist opening with copper.

According to still another preferred embodiment of this invention, a method for fabricating a solder pad structure of a circuit board includes: providing a circuit board having thereon at least one copper pad structure; forming a solder resist layer on a surface of the circuit board; forming a protective layer on the solder resist layer; forming a solder resist opening in the protective layer and the solder resist layer to expose a portion of the copper pad structure; selectively forming a seed layer on interior surface of the solder resist opening; and filling the solder resist opening with copper.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
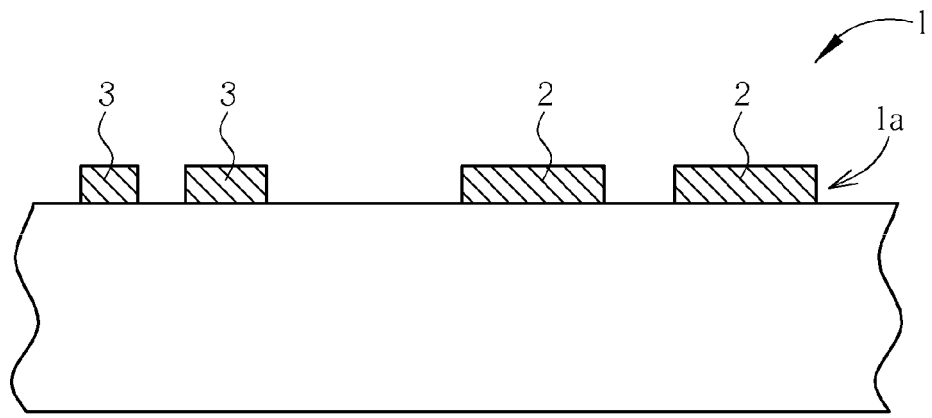
FIG. 1 to FIG. 5 demonstrate a conventional solder resist process and the solder paste printing process after the solder resist process.
Figure 2:
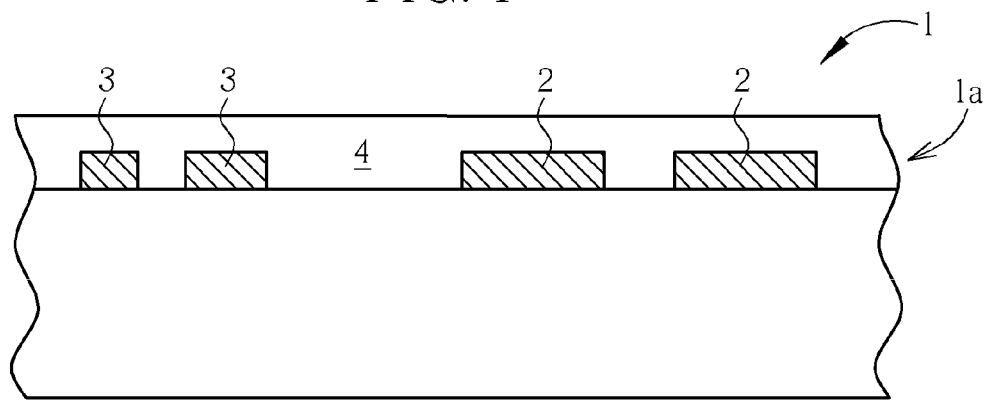
Figure 3:
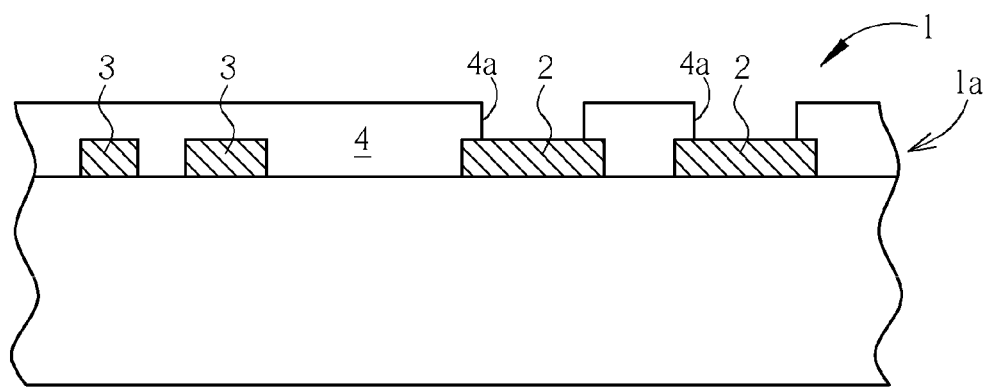
Figure 4:
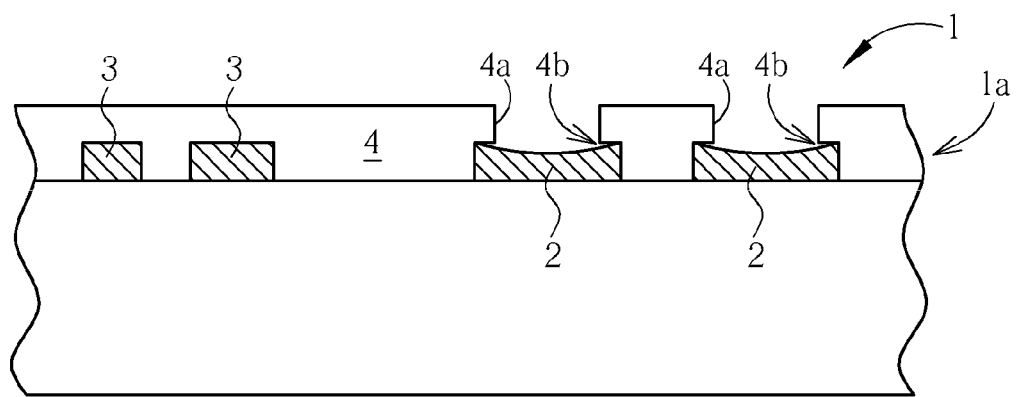
Figure 5:
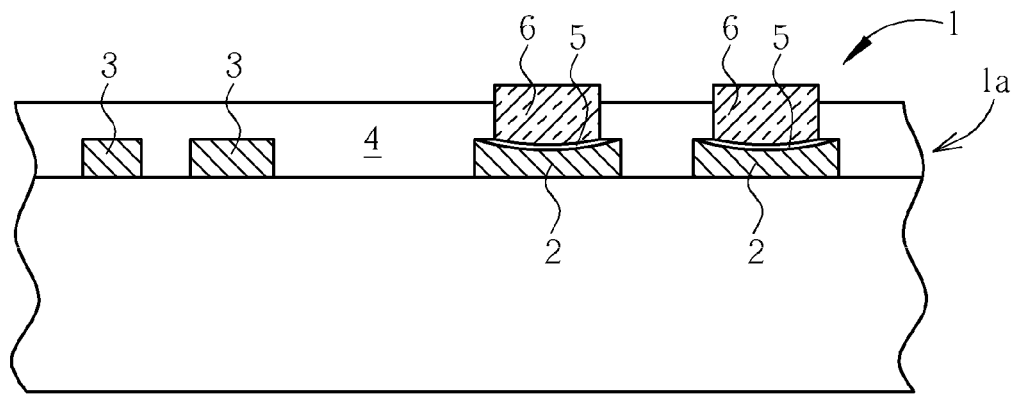
Figure 6:
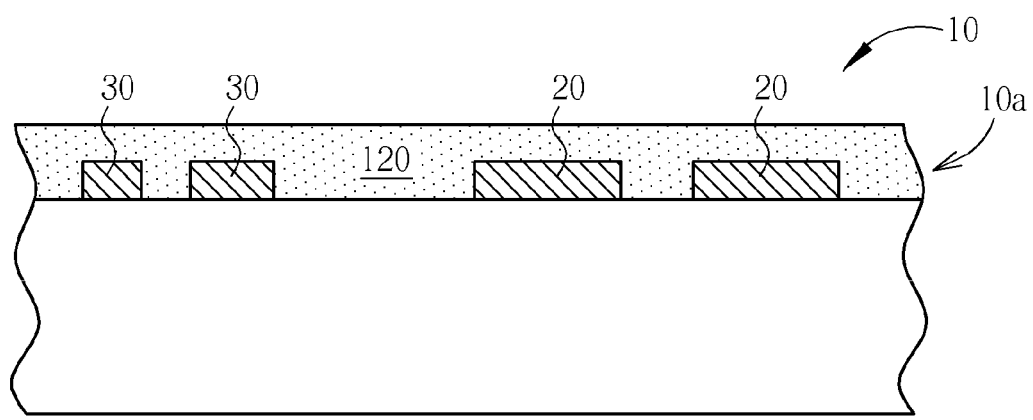
FIG. 6 to FIG. 9 are schematic, cross-sectional diagrams showing a method for fabricating a solder pad structure on a circuit board in accordance with one preferred embodiment of this invention.

FIG. 6 to FIG. 9 are schematic, cross-sectional diagrams showing a method for fabricating a solder pad structure on a circuit board in accordance with one preferred embodiment of this invention. First, as shown in FIG. 6, a surface wiring structure 10a is provided on the surface of the circuit board 10. The surface wiring structure 10a may include but not limited to a plurality of copper pad structure 20 and fine traces 30. It is to be understood that the circuit board 10 may be a single wiring layer circuit board, double wiring layer circuit board or multiple wiring layer circuit board. For the sake of simplicity, the conductive via holes or other inner layer interconnection inside the circuit board 10 are not shown in the figures.

After the formation of the surface wiring structure 10a, a non-conductive material layer 120 is coated on the surface of the circuit board 10. The non-conductive material layer 120 comprises a dielectric matrix and laser-activable catalytic particles. The catalytic particles are evenly dispersed in the dielectric matrix. The aforesaid catalytic particles may be activated by laser energy and a conductive layer may be selectively deposited on the laser-activated traces on the non-conductive material layer 120.

According to the preferred embodiment of this invention, the dielectric matrix comprises polymer material such as epoxy resins, modified epoxy resins, polyesters, acrylate, fluoro-containing polymer, (PPO) polyphenylene oxide (PPO), polyimide, phenolic resins, polysulfone (PSF), Si-containing polymer, BT resins, polycyanate, polyethylene, polycarbonate, acrylonitrile-butadiene-styrene copolymer, polyethylene terephthalate (PET), polybutylene terephthalate (PBT), liquid crystal polymers (LCP), polyamide (PA), Nylon 6, nylonpolyoxymethylene (POM) polyphenylene sulfide (PPS), COC or a combination thereof.

According to the preferred embodiment of this invention, the catalytic particles described above may be nano-particles of metals or metal coordination compounds. For example, suitable metal coordination compounds may include metal oxides, metal nitrides, metal complexes and/or metal chelating compounds. In one embodiment of the present invention, the aforesaid metal may include but not limited to zinc, copper, silver, gold, nickel, palladium, platinum, cobalt, rhodium, iridium, indium, iron, manganese, aluminum, chromium, tungsten, vanadium, tantalum, and/or titanium.

Figure 7:
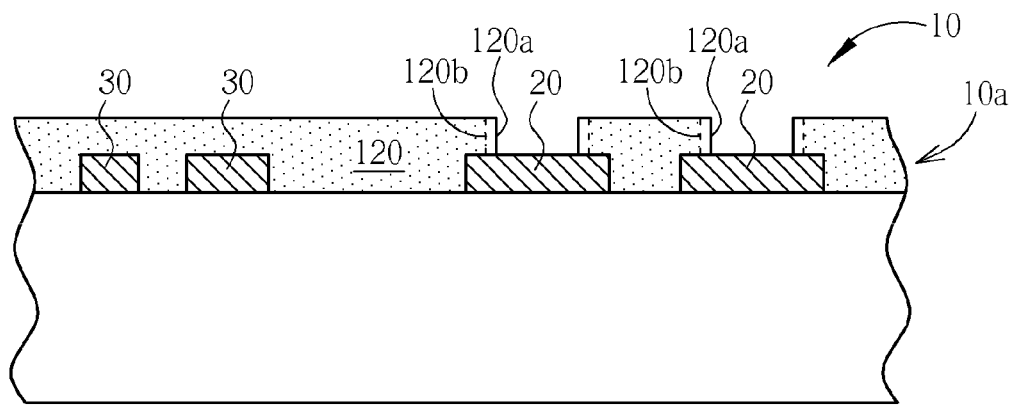

As shown in FIG. 7, a specific laser beam such as UV laser is directed to the top surface of the non-conductive material layer 120 to etch openings 120a into the non-conductive material layer 120. Each of the opening 120a exposes a portion of each of the copper pads 20. Optionally, a desmear process may be carried out to ensure removal of epoxy-smear or residuals from the exposed surface of the copper pad 20. Suitable desmear process may include but not limited to plasma or oxidation methods. For example, permanganate may be used as an oxidant in the desmear process. At this point, the catalytic particles inside the opening 120a are activated by laser, thereby forming a laser activated layer 120b on sidewall of each of the openings 120a.

Figure 8:
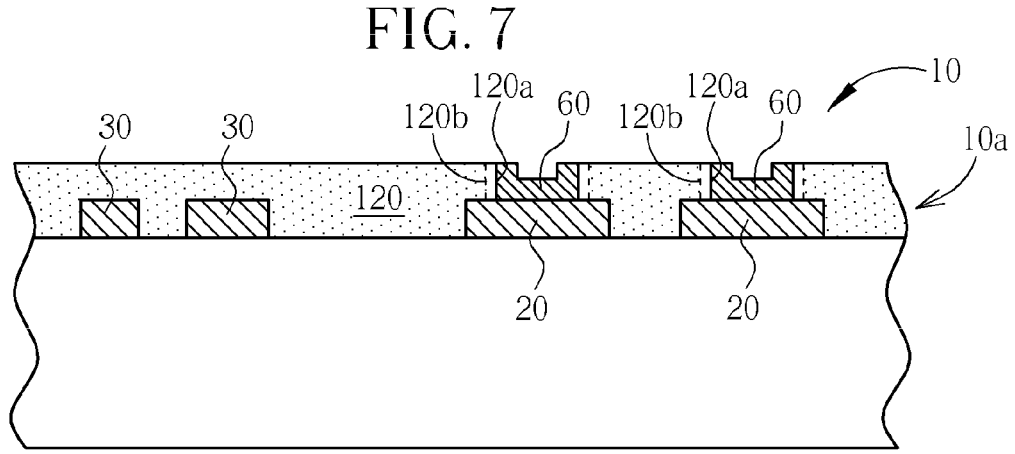
Figure 9:
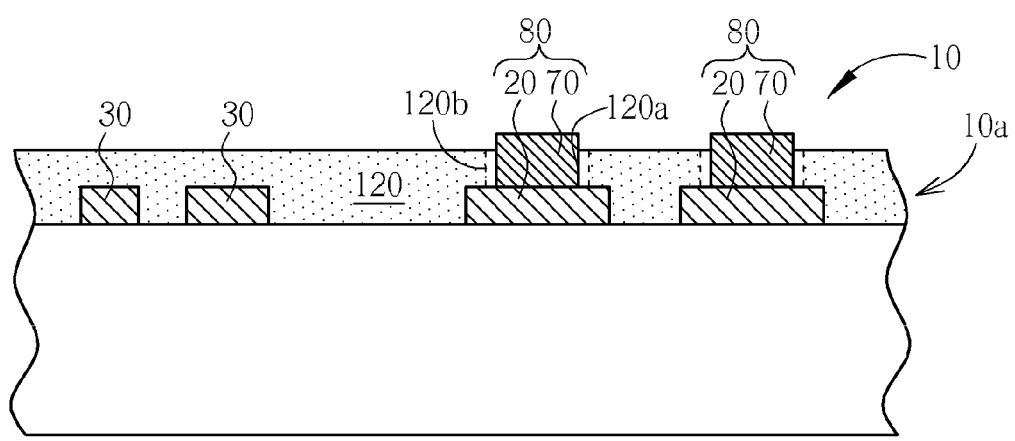

As shown in FIG. 8, a chemical copper deposition or plating process is carried out to grow chemical copper 60 from the laser activated layer 120b and from the exposed top surface of the copper pad 20 at the same time. Since the chemical copper 60 is directly grown from the laser activated layer 120b on the sidewall of the opening 120a, a tight bonding between the chemical copper 60 and the non-conductive material layer 120 is created. Optionally, the chemical copper 60 may continue to grow until it protrudes from the top surface of the non-conductive material layer 120 to thereby form a bump structure 70, as shown in FIG. 9. The bump structure 70 and the copper pad structure 20 together constitute a solder pad structure 80.

The present invention comprises at least the following advantages. First, the laser method for forming the opening 120a provides higher accuracy compared to the conventional photolithographic process. Second, the production throughput is improved because the chemical copper 60 grows simultaneously from the laser activated layer 120b on the sidewall of the opening 120a and from the exposed top surface of the copper pad 20. Third, since the bump structure 70 is grown on the copper pad 20, the poor yield due to conventional solder paste printing can be avoided. In addition, direct bonding between the chemical copper 60 or the bump structure 70 and the sidewall laser-activated layer 120b improves the reliability of the solder pad structure 80.

Figure 10:
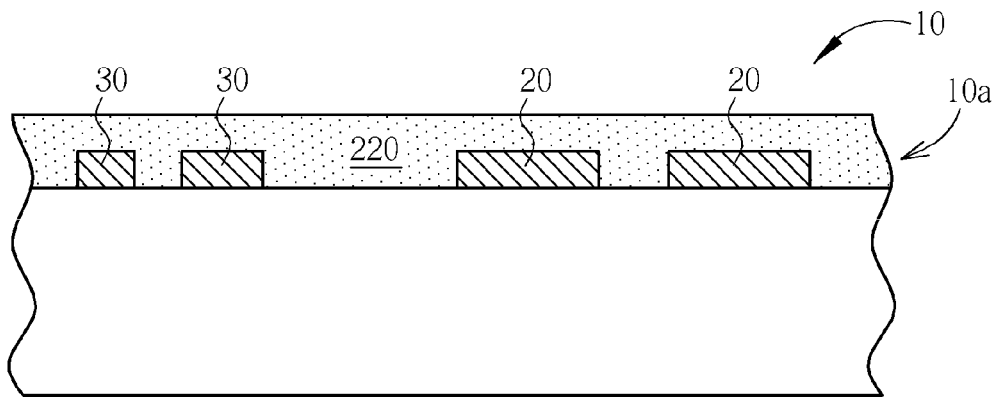
FIG. 10 to FIG. 15 are schematic, cross-sectional diagrams showing a method for fabricating a solder pad structure on a circuit board in accordance with another preferred embodiment of this invention.

FIG. 10 to FIG. 15 are schematic, cross-sectional diagrams showing a method for fabricating a solder pad structure on a circuit board in accordance with another preferred embodiment of this invention. As shown in FIG. 10, likewise, a surface wiring structure 10a is provided on the surface of the circuit board 10. The surface wiring structure 10a may include but not limited to a plurality of copper pad structure 20 and fine traces 30. For the sake of simplicity, the conductive via holes or other inner layer interconnection inside the circuit board 10 are not shown in the figures.

After the formation of the surface wiring structure 10a, a solder resist layer 220 is coated on the surface of the circuit board 10. The solder resist layer 220 comprises a dielectric matrix and laser-activable catalytic particles. The catalytic particles are evenly dispersed in the dielectric matrix. The aforesaid catalytic particles may be activated by laser energy and a conductive layer may be selectively deposited on the laser-activated traces on the non-conductive material layer 120. However, the solder resist layer 220 may be composed of photo-sensitive polymers or inks.

The aforesaid dielectric matrix may comprise polymer material such as epoxy resins, modified epoxy resins, polyesters, acrylate, fluoro-containing polymer, (PPO) polyphenylene oxide (PPO), polyimide, phenolic resins, polysulfone (PSF), Si-containing polymer, BT resins, polycyanate, polyethylene, polycarbonate, acrylonitrile-butadiene-styrene copolymer, polyethylene terephthalate (PET), polybutylene terephthalate (PBT), liquid crystal polymers (LCP), polyamide (PA), Nylon 6, nylonpolyoxymethylene (POM) polyphenylene sulfide (PPS), COC or a combination thereof.

The aforesaid catalytic particles described above may be nano-particles of metals or metal coordination compounds. For example, suitable metal coordination compounds may include metal oxides, metal nitrides, metal complexes and/or metal chelating compounds. In one embodiment of the present invention, the aforesaid metal may include but not limited to zinc, copper, silver, gold, nickel, palladium, platinum, cobalt, rhodium, iridium, indium, iron, manganese, aluminum, chromium, tungsten, vanadium, tantalum, and/or titanium.

Figure 11:
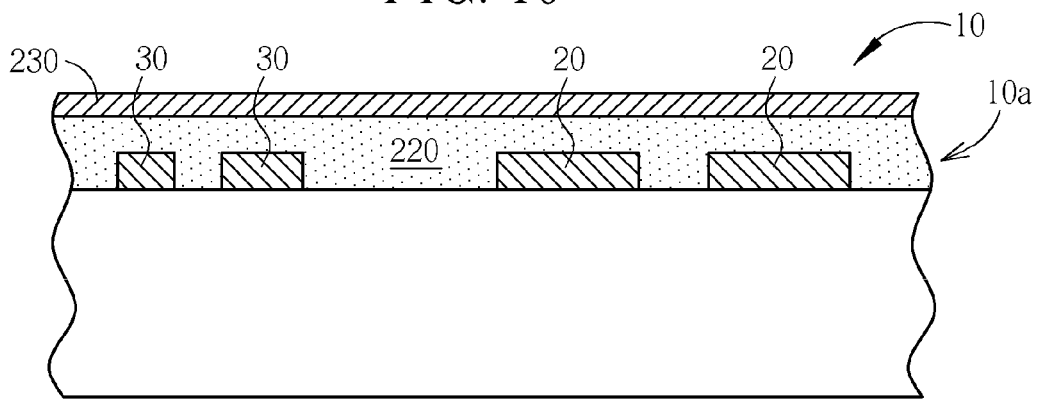

As shown in FIG. 11, a peelable film 230 is formed on the solder resist layer 220. For example, the peelable film 230 may be a polymer release film such as polyester film or the like. Preferably, the peelable film 230 has a thickness of about 1-2 micrometers, but not limited thereto.

Figure 12:
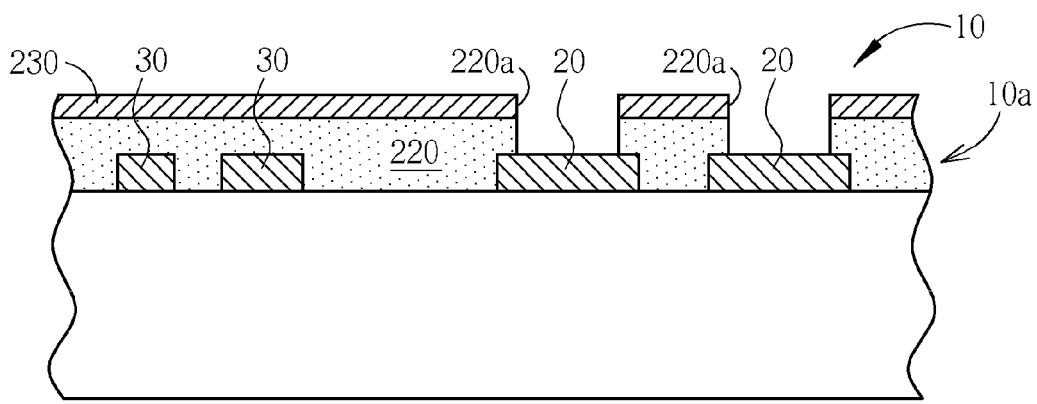

As shown in FIG. 12, a specific laser beam such as UV laser is directed to the top surface of the peelable film 230 to etch openings 220a into the peelable film 230 and the solder resist layer 220. Each of the opening 220a exposes a portion of each of the copper pads 20. Optionally, a desmear process may be carried out to ensure removal of epoxy-smear or residuals from the exposed surface of the copper pad 20. Suitable desmear process may include but not limited to plasma or oxidation methods. For example, permanganate may be used as an oxidant in the desmear process.

Figure 13:
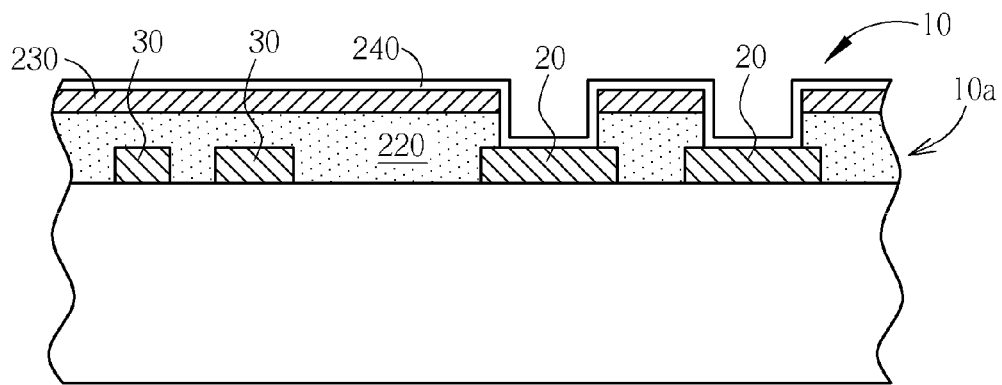

As shown in FIG. 13, a seed layer 240, for example, Pd, Ti, W or the like, is conformally deposited on the interior sidewall of the openings 220a, the exposed surface of the copper pad 20 and on the top surface of the peelable film 230. Notably, the seed layer 240 is conformally deposited on the circuit board 10 and does not fill up the openings 220a. According to the preferred embodiment of this invention, the seed layer 240 may be an organic seed layer or an inorganic seed layer.

Figure 14:
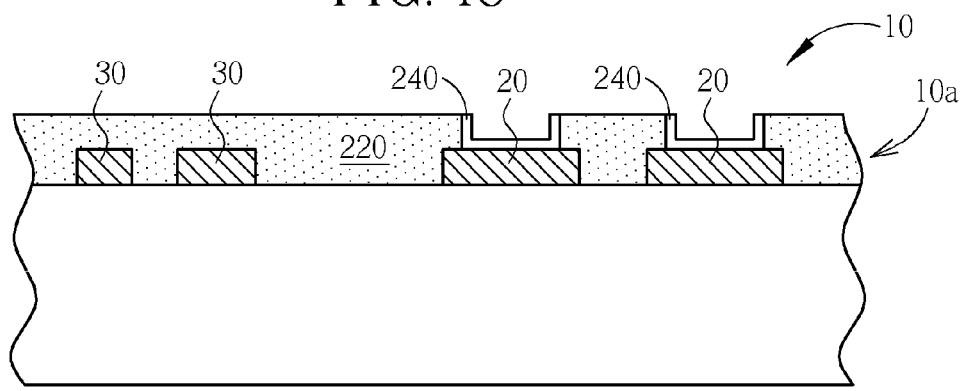

As shown in FIG. 14, after the conformal deposition of the seed layer 240, the peelable film 230 is peeled off from the surface of the solder resist layer 220. A portion of the seed layer 240 that is situated on the peelable film 230 is also removed, thereby leaving the other portion of the seed layer 240 on the interior sidewall of the openings 220a intact.

Figure 15:
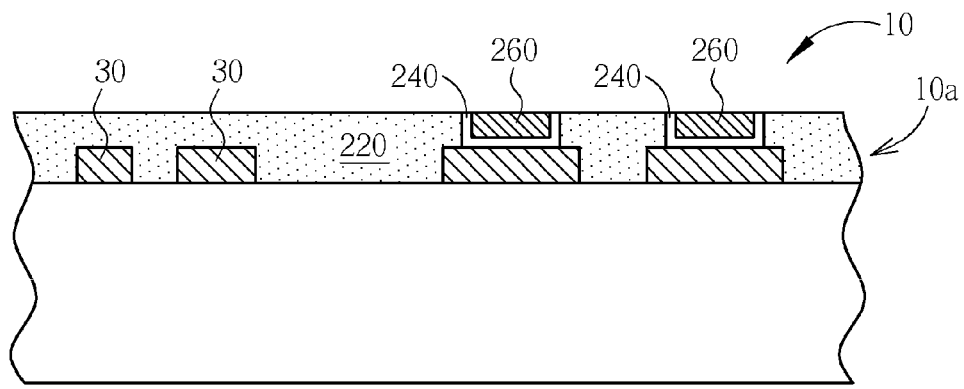

As shown in FIG. 15, a chemical copper deposition or plating process is then carried out to fill the openings 220a with chemical copper 260. A top surface of the chemical copper 260 may be lower than the top surface of the solder resist layer 220. In another case, the top surface of the chemical copper 260 may be higher than the top surface of the solder resist layer 220. The production throughput is improved since the chemical copper 260 is grown from the seed layer 240 in different directions, for example, from the sidewall directions and from the top of the pad 20 at the same time.

Figure 16:
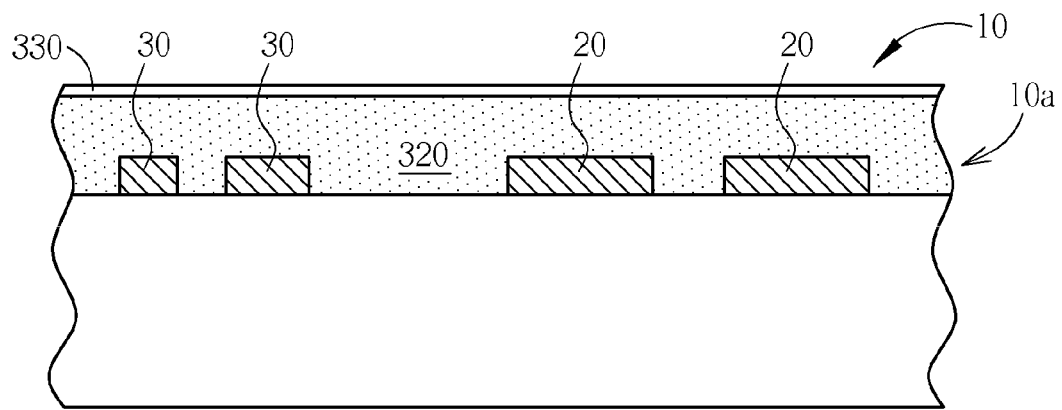
FIG. 16 to FIG. 19 are schematic, cross-sectional diagrams showing a method for fabricating a solder pad structure on a circuit board in accordance with still another preferred embodiment of this invention.

FIG. 16 to FIG. 19 are schematic, cross-sectional diagrams showing a method for fabricating a solder pad structure on a circuit board in accordance with still another preferred embodiment of this invention. As shown in FIG. 16, likewise, a surface wiring structure 10a is provided on the surface of the circuit board 10. The surface wiring structure 10a may include but not limited to a plurality of copper pad structure 20 and fine traces 30. For the sake of simplicity, the conductive via holes or other inner layer interconnection inside the circuit board 10 are not shown in the figures.

After the formation of the surface wiring structure 10a, a solder resist layer 320 is coated on the surface of the circuit board 10. The solder resist layer 320 may be composed of photo-sensitive polymers or inks. Subsequently, a protective layer 330 is coated on the surface of the solder resist layer 320. The protective layer 330 may be coated by printing or spraying methods. Preferably, the protective layer 330 has a thickness that is less than 2 micrometers. Preferably, the protective layer 330 is composed of nano-coating or nano-paint comprising nano-scale particles.

Figure 17:
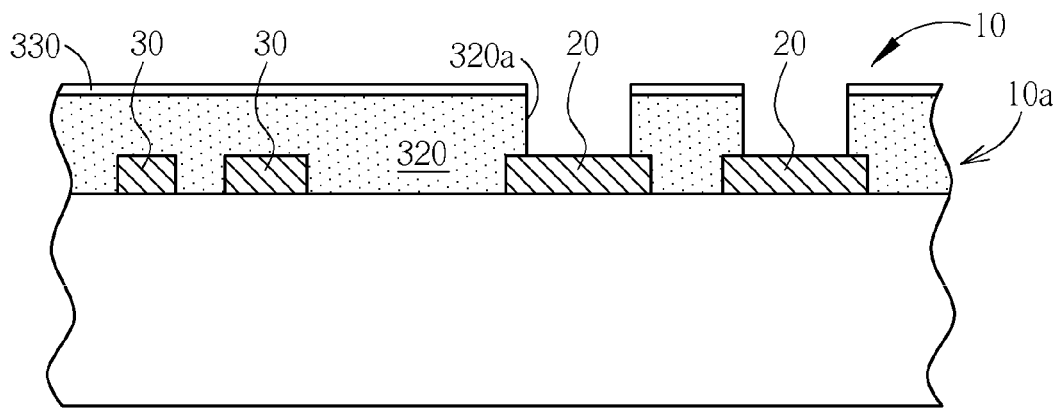

As shown in FIG. 17, a specific laser beam such as UV laser is directed to the top surface of the protective layer 330 to etch openings 320a into the protective layer 330 and the solder resist layer 320. Each of the opening 320a exposes a portion of each of the copper pads 20. Optionally, a desmear process may be carried out to ensure removal of epoxy-smear or residuals from the exposed surface of the copper pad 20. Suitable desmear process may include but not limited to plasma or oxidation methods. For example, permanganate may be used as an oxidant in the desmear process.

Figure 18:
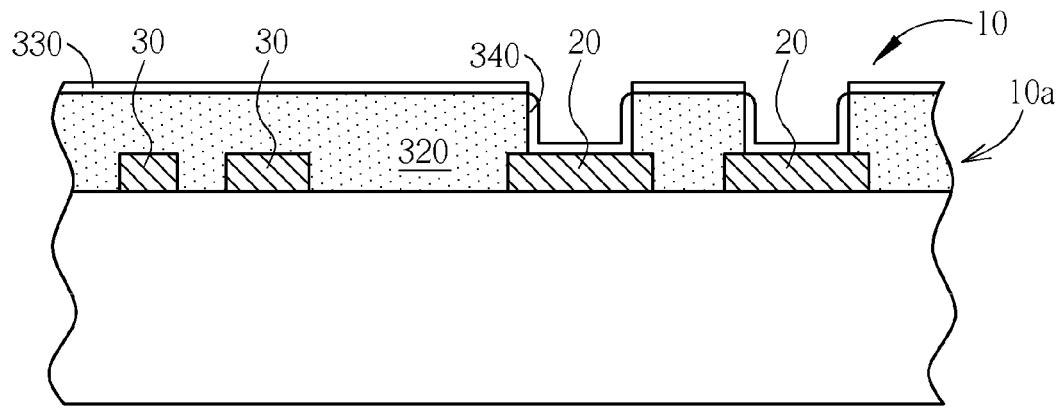

As shown in FIG. 18, after the formation of the openings 320a, a seed layer 340, for example, Pd, Ti, W or the like, is selectively deposited on the interior sidewall of the openings 320a, the exposed surface of the copper pad 20 but not deposited on the top surface of the protective layer 330. The seed layer 340 is conformally deposited on the interior sidewall of the openings 320a and does not fill up the openings 320a. According to the preferred embodiment of this invention, the seed layer 340 may be an organic seed layer or an inorganic seed layer.

Figure 19:
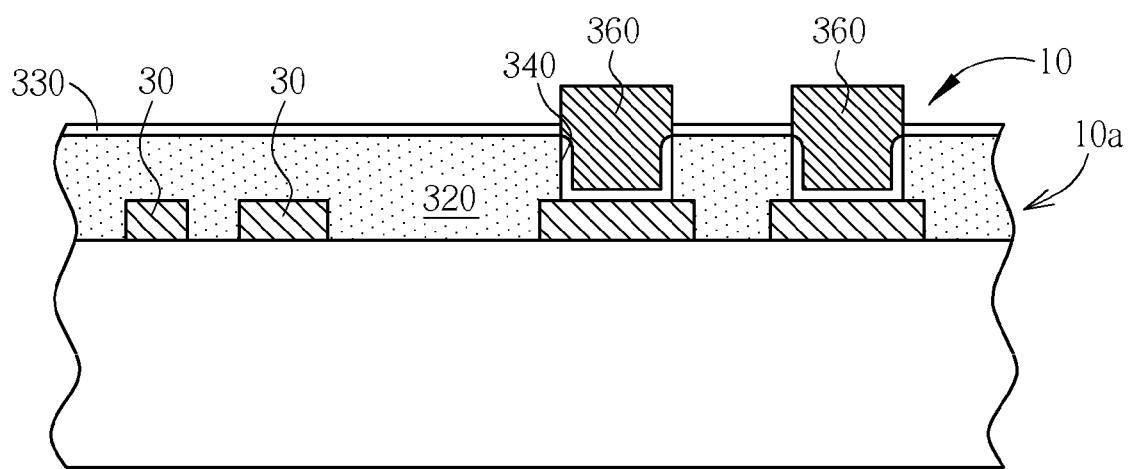

As shown in FIG. 19, a chemical copper deposition or plating process is then carried out to fill the openings 320a with chemical copper 360. A top surface of the chemical copper 360 may be lower than the top surface of the protective layer 330. In another case, the top surface of the chemical copper 360 may be higher than the top surface of the protective layer 330. The production throughput is improved since the chemical copper 360 is grown from the seed layer 340 in different directions within the openings 320a at the same time.

Those skilled in the art will readily observe that numerous modifications and alterations of the device and method may be made while retaining the teachings of the invention.

What is claimed is:

1. A method for fabricating a solder pad structure of a circuit board, comprising:

providing a circuit board having thereon at least one copper pad structure;

forming a solder resist layer on a surface of the circuit board;

subjecting the solder resist layer to a laser to thereby form a solder resist opening exposing a portion of the copper pad structure, the laser simultaneously forming a laser-activated layer on sidewall of the solder resist opening; and growing copper from the laser-activated layer on sidewall of the solder resist opening and from the exposed portion of the copper pad structure, wherein the copper is not formed on a top surface of the solder resist layer.

2. The method of claim 1 wherein the solder resist layer comprises a dielectric matrix and laser activable particles evenly dispersed in the dielectric matrix.

3. The method of claim 2 wherein the dielectric matrix comprises epoxy resins, modified epoxy resins, polyesters, acrylate, fluoro-containing polymer, polyphenylene oxide (PPO), polyimide, phenolic resins, polysulfone (PSF), Si-containing polymers, BT resins, polycyanate, polyethylene, polycarbonate, acrylonitrile-butadiene-styrene copolymer, polyethylene terephthalate (PET), polybutylene terephthalate (PBT), liquid crystal polymers (LCP), polyamide (PA), Nylon 6, nylonpolyoxymethylene (POM) polyphenylene sulfide (PPS), COC or a combination thereof.

4. The method of claim 2 wherein the catalytic particles comprise nano-particles of metal or metal coordination compound.

5. A method for fabricating a solder pad structure of a circuit board, comprising:

providing a circuit board having thereon at least one copper pad structure;

forming a solder resist layer on a surface of the circuit board;

forming a peelable film on the solder resist layer;

subjecting the peelable film and the solder resist layer to a laser to thereby form a solder resist opening exposing a portion of the copper pad structure;

forming a seed layer on interior sidewall of the solder resist opening;

peeling off the peelable film from the solder resist layer; and filling the solder resist opening with copper.

6. The method of claim 5 wherein the solder resist layer is composed of photo-sensitive polymers or inks.

7. The method of claim 5 wherein the solder resist layer comprises a dielectric matrix and laser activable particles evenly dispersed in the dielectric matrix.

8. The method of claim 7 wherein the dielectric matrix comprises epoxy resins, modified epoxy resins, polyesters, acrylate, fluoro-containing polymer, polyphenylene oxide (PPO), polyimide, phenolic resins, polysulfone (PSF), Si-containing polymers, BT resins, polycyanate, polyethylene, polycarbonate, acrylonitrile-butadiene-styrene copolymer, polyethylene terephthalate (PET), polybutylene terephthalate (PBT), liquid crystal polymers (LCP), polyamide (PA), Nylon 6, nylonpolyoxymethylene (POM) polyphenylene sulfide (PPS), COC or a combination thereof.

9. The method of claim 7 wherein the catalytic particles comprise nano-particles of metal or metal coordination compound.

10. The method of claim 5 wherein the peelable film comprises polyester release film.

11. The method of claim 5 wherein the seed layer comprises Pd, Ti or W.

12. The method of claim 5 wherein the seed layer is conformally deposited on the circuit board and does not fill up the solder resist opening.

13. A method for fabricating a solder pad structure of a circuit board, comprising:

provided a circuit board having thereon at least one copper pad structure;

forming a solder resist layer on a surface of the circuit board;

forming a protective layer on the solder resist layer;

forming a solder resist opening in the protective layer and the solder resist layer to expose a portion of the copper pad structure;

selectively forming a seed layer on interior surface of the solder resist opening, wherein the seed layer is not formed on a top surface of the protective layer; and filling the solder resist opening with copper.

14. The method of claim 13 wherein the solder resist layer is composed of photo-sensitive polymers or inks.

15. The method of claim 13 wherein the protective layer comprises nano-coating or nano-paint.

16. The method of claim 13 wherein the seed layer comprises Pd, Ti or W.

17. The method of claim 13 wherein the seed layer is merely deposited on the interior surface of the solder resist opening and is not deposited on the protective layer.

* * * * *